(12) United States Patent
Wang (10) Patent No.: US 10,204,941 B2
(45) Date of Patent: Feb. 12, 2019

(54) METHOD FOR MANUFACTURING ARRAY SUBSTRATE HAVING SOURCE AND DRAIN TRANSFER PORTIONS INTEGRATED WITH CHANNEL

(71) Applicant: Shenzhen China Star Optoelectronics Technology Co., Ltd., Shenzhen, Guangdong (CN)

(72) Inventor: Zhiwu Wang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 124 days.

(21) Appl. No.: 15/125,176

(22) PCT Filed: Jun. 16, 2016

(86) PCT No.: PCT/CN2016/085996
§ 371 (c)(1),
(2) Date: Sep. 11, 2016

(87) PCT Pub. No.: WO2017/185497
PCT Pub. Date: Nov. 2, 2017

(65) Prior Publication Data
US 2018/0145097 A1   May 24, 2018

(30) Foreign Application Priority Data
Apr. 29, 2016   (CN) .......................... 2016 1 0284066

(51) Int. Cl.
*H01L 27/12* (2006.01)
*G02F 1/1333* (2006.01)
(Continued)

(52) U.S. Cl.
CPC .... *H01L 27/1274* (2013.01); *G02F 1/133345* (2013.01); *G02F 1/136209* (2013.01);
(Continued)

(58) Field of Classification Search
CPC .......... H01L 27/1251; H01L 29/66742; H01L 27/1274
See application file for complete search history.

(56) References Cited

U.S. PATENT DOCUMENTS

| 8,119,465 B1 * | 2/2012 | Lin ..................... H01L 29/7869 |
| | | 257/E21.37 |
| 9,142,573 B1 * | 9/2015 | Yamashita ........ G02F 1/136213 |
| 2008/0012476 A1 | 1/2008 | Kim et al. |

FOREIGN PATENT DOCUMENTS

| CN | 101097873 A | 1/2008 |
| CN | 102064109 A | 5/2011 |

(Continued)

*Primary Examiner* — Quoc D Hoang
(74) *Attorney, Agent, or Firm* — Andrew C. Cheng (57) ABSTRACT

The present application discloses an array substrate, a liquid crystal display panel and method of manufacturing the array substrate, the array substrate includes a substrate, a gate electrode, a gate insulating layer and an active layer formed in stack subsequently; the active layer includes a source transfer portion and a drain transfer portion isolated from the source transfer portion and a channel integrally connected to the source transfer portion and the drain transfer portion, the contact resistance between the source transfer portion, the drain transfer portion and the channel is reduced, the interface defects in the channel is reduced, so that the on-state current is increased, and the off-state current is reduced through the source transfer portion and the drain transfer portion of the thin film transistor of the liquid crystal display panel, that is the on/off ratio is raised to improve the performance of the array substrate.

4 Claims, 5 Drawing Sheets

(51) Int. Cl.
  *G02F 1/1362* (2006.01)
  *H01L 29/786* (2006.01)
  *G02F 1/1368* (2006.01)
  *H01L 21/77* (2017.01)

(52) U.S. Cl.
  CPC .......... *H01L 27/12* (2013.01); *H01L 27/1218* (2013.01); *H01L 27/1225* (2013.01); *H01L 29/7869* (2013.01); *H01L 29/78618* (2013.01); *G02F 1/1368* (2013.01); *G02F 2202/10* (2013.01); *H01L 21/77* (2013.01)

(56) References Cited

FOREIGN PATENT DOCUMENTS

| | | |
|---|---|---|
| CN | 103219283 A | 7/2013 |
| CN | 104637950 A | 5/2015 |

* cited by examiner

METHOD FOR MANUFACTURING ARRAY SUBSTRATE HAVING SOURCE AND DRAIN TRANSFER PORTIONS INTEGRATED WITH CHANNEL

CROSS REFERENCE

This application claims the priority of Chinese Patent Application No. 201610284066.7, entitled "ARRAY SUBSTRATE, LIQUID CRYSTAL DISPLAY PANEL AND METHOD OF MANUFACTURING THE ARRAY SUBSTRATE", filed on Apr. 29, 2016, the disclosure of which is incorporated herein by reference in its entirety.

FIELD OF THE INVENTION

The present application relates to a display technology field, and more particularly to an array substrate, liquid crystal display panel and method of manufacturing the array substrate.

BACKGROUND OF THE INVENTION

The steps of the formation of a source electrode, a drain electrode and a channel is separate in the current liquid crystal display panel, at first, a metal oxide layer is preformed annealing at a certain temperature to form the channel, and the source electrode and the drain electrode are connected to the metal oxide layer, such that the source electrode and the drain electrode is conducting after contact with the metal oxide. However, in this approach, since the source electrode, the drain electrode and the metal oxide is connected by the way of contacting, causing the contact resistance between the source and drain electrodes and the metal oxide layer is larger, making poor contact characteristics, and causing the on-state current (Ion) through the source and the drain electrodes of the thin film transistor of the liquid crystal display panel is less. At the same time, the source electrode, the drain electrode and the metal oxide is connected to the metal oxide layer by the way of contacting makes more defects occurred in the interface of the metal oxide layer, resulting off-state current (Ioff) through the source and the drain electrodes of the thin film transistor of the liquid crystal display panel is larger, making the turn on and turn off ratio (Ion/Ioff) of the thin film transistor is less, and having serious impact on the performance of the thin film transistor of the liquid crystal display panel, thereby affecting the performance of the liquid crystal display panel.

SUMMARY OF THE INVENTION

The present application provides an array substrate with high on/off ratio, a liquid crystal display panel and method of manufacturing the array substrate.

An array substrate provided in the present application, wherein the array substrate including a substrate, a gate electrode, a gate insulating layer and an active layer formed in stack subsequently; the active layer including a source transfer portion and a drain transfer portion isolated from the source transfer portion, and a channel integrally connected to the source transfer portion and the drain transfer portion; wherein the source transfer portion and the drain transfer portion are formed at a first predetermined temperature; the channel is formed at a second predetermined temperature; and the first predetermined temperature is higher than the second predetermined temperature.

Wherein the array substrate further including a barrier layer, the barrier layer including a first through hole and a second through hole isolated from the first through hole 1, and a light shielding area formed between the first through hole and the second through hole; the first through hole and the second through hole expose the source transfer portion and the drain transfer portion respectively; and the light shielding area is covering the channel.

Wherein the array substrate further including a source electrode and a drain electrode disposed on the barrier layer, the source electrode is connected to the source transfer portion through the first through hole, and the drain electrode is connected to the drain transfer portion through the second through hole.

Wherein the array substrate including a plastic layer and a buffer layer stacked on the plastic layer, wherein the gate electrode is stacked on the buffer layer and opposite to the plastic layer.

Wherein the active layer is made by the oxide semiconductor, the source transfer portion and the drain transfer portion located at both ends of the active layer is formed by laser crystallization process.

The present application further provides a liquid crystal display panel, wherein the liquid crystal display panel including any one of the array substrate described above.

A method of manufacturing is also provided in the present application, the manufacturing step including:

forming a gate electrode, a gate insulating layer and a metal oxide layer on the substrate subsequently; the metal oxide layer including a first region and a second region isolated from the first region, and a third region connected to the first region and the second region; and processing the metal oxide layer, the first region and the second region are formed into the source transfer portion and the drain transfer portion at a first predetermined temperature respectively, the third region is formed the channel at a second predetermined temperature.

Wherein the method of manufacturing an array substrate further including:

forming a barrier layer on the metal oxide layer, the barrier layer including a first through hole and a second through hole isolated from the first through hole, and a light shielding area formed between the first through hole and the second through hole; the first through hole and the second through hole expose the first region and the second region respectively; and the light shielding area is covering the third region; and in the step of "processing the metal oxide layer," the barrier layer and the opposite side of the metal oxide layer are formed an annealing process.

Wherein the annealing process is realized by a laser crystallization process.

Wherein the step to form a barrier layer on the metal oxide layer including:

forming a complete barrier layer to be processed on the metal oxide layer; and etching the regions of the barrier layer to be processed corresponding to the first region and the second region respectively to form the first through hole and the second through the hole.

The present application provides an array substrate, a liquid crystal display panel and method of manufacturing the array substrate, by the design of the active layer includes the source transfer portion and the drain transfer portion isolated from the source transfer portion and the channel integrally connected to the source transfer portion and the drain transfer portion makes the source transfer portion, the drain transfer portion and the channel becomes an integral structure, i.e., the contact resistance between the source transfer portion, the drain transfer portion and the channel is reduced, so that the on-state current is increased, and the off-state current is reduced through the source and drain electrodes in the thin film transistor of the liquid crystal display panel, that is the on/off ratio is raised to improve the performance of the array substrate. In addition, in the laser irradiation process to form the source transfer portion and the drain transfer portion, the defects in the channel is significantly reduced by the annealing process, to improve the performance of thin film transistors.

BRIEF DESCRIPTION OF THE DRAWINGS

In order to more clearly illustrate the embodiments of the present application or prior art, the following figures will be described in the embodiments are briefly introduced. It is obvious that the drawings are merely some embodiments of the present application, those of ordinary skill in this field can obtain other figures according to these figures without paying the premise.

DETAILED DESCRIPTION OF PREFERRED EMBODIMENTS

Embodiments of the present application are described in detail with the technical matters, structural features, achieved objects, and effects with reference to the accompanying drawings as follows. It is clear that the described embodiments are part of embodiments of the present application, but not all embodiments. Based on the embodiments of the present application, all other embodiments to those of ordinary skill in the premise of no creative efforts obtained should be considered within the scope of protection of the present application.

Specifically, the terminologies in the embodiments of the present application are merely for describing the purpose of the certain embodiment, but not to limit the invention. Examples and the claims be implemented in the present application requires the use of the singular form of the book "an", "the" and "the" are intend to include most forms unless the context clearly dictates otherwise. It should also be understood that the terminology used herein that "and/or" means and includes any or all possible combinations of one or more of the associated listed items.

Figure 1:
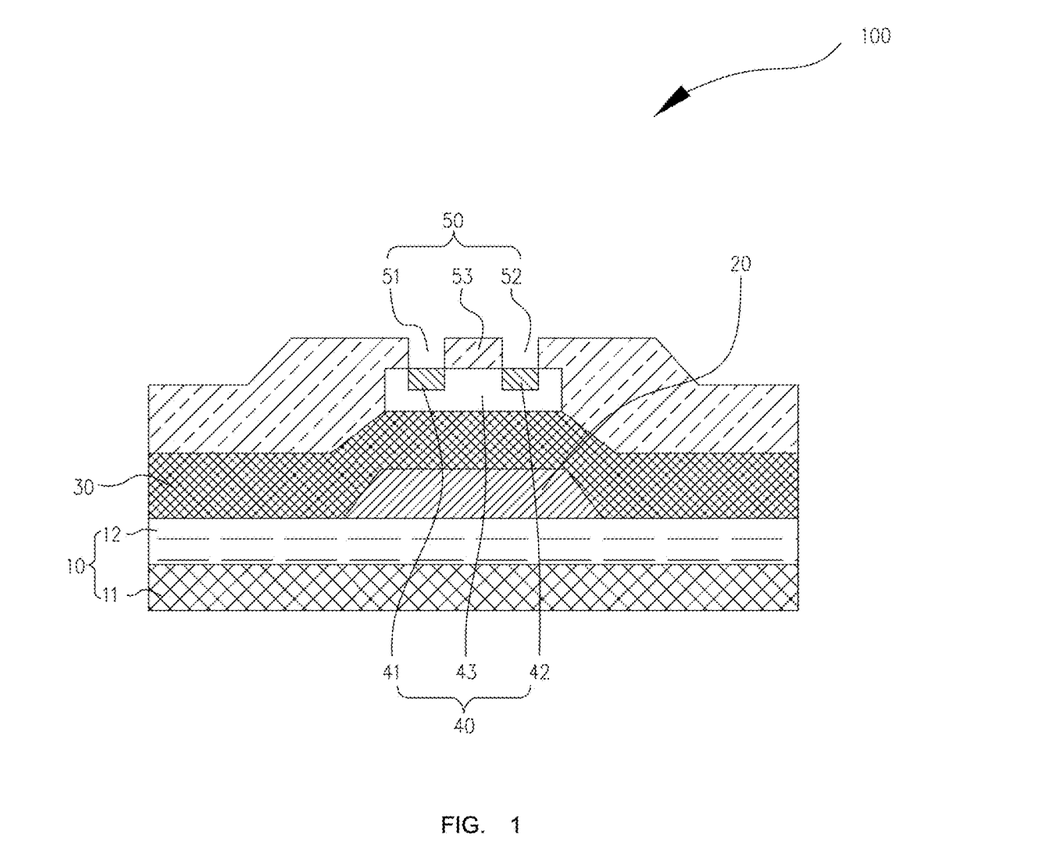
FIG. 1 illustrates a schematic structure of an array substrate of the present application.
Figure 3:
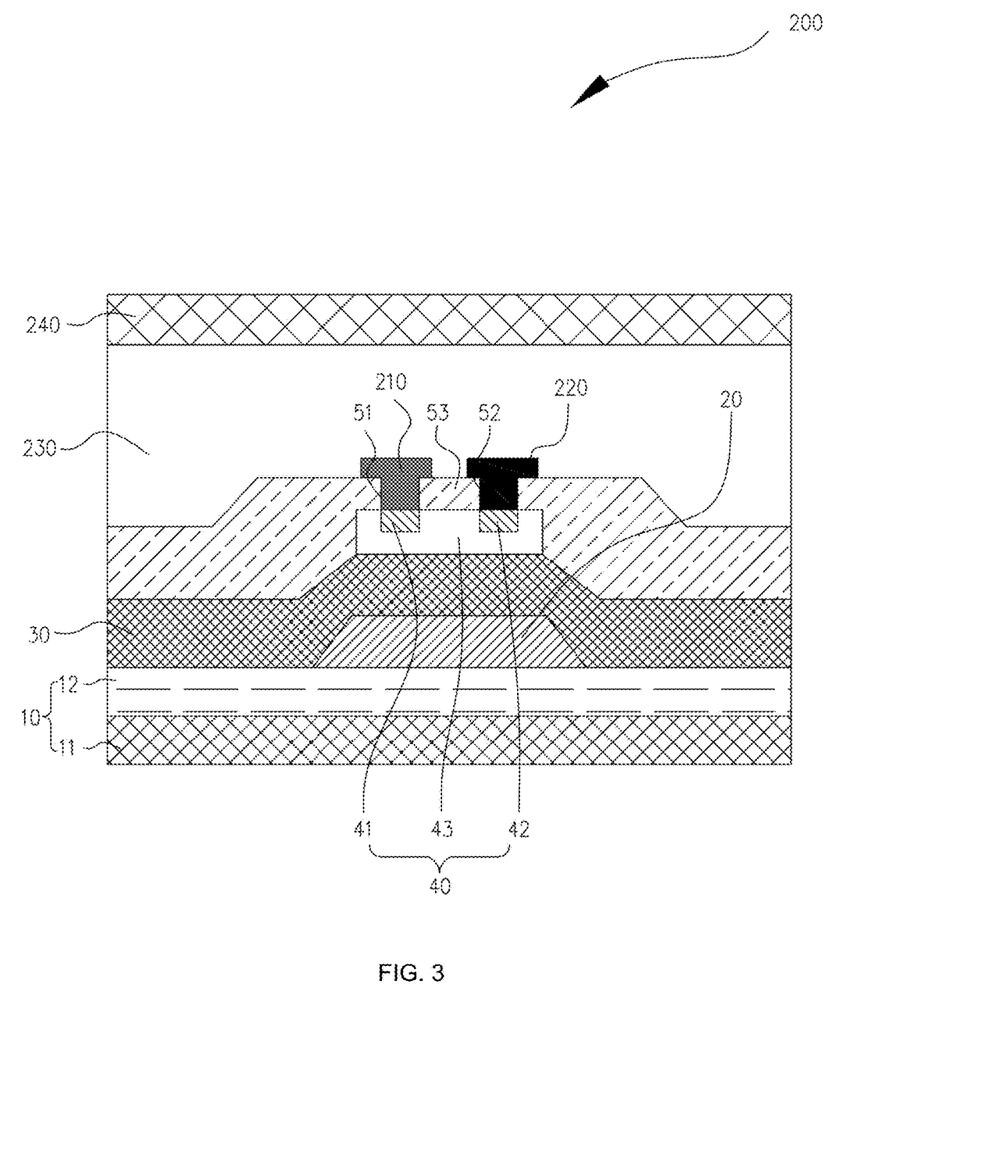
FIG. 3 illustrates a schematic structure of a liquid crystal display panel of the present application.

Referring to FIGS. 1 and 3, an array substrate 100 is provided in the present application, the array substrate 100, the array substrate 100 includes a substrate 10, a gate electrode 20, a gate insulating layer 30 and an active layer 40 formed in stack subsequently. The active layer includes a source transfer portion 41 and a drain transfer portion 42 isolated from the source transfer portion 41, and a channel 43 integrally connected to the source transfer portion 41 and the drain transfer portion 42. It can be understood that the array substrate 100 is applied to the liquid crystal display panel 200, the source transfer portion 41 and the drain transfer portion 42 of the array substrate 100 can be electrically connected to a source electrode 210 and a source electrode 220 respectively. The conductive properties of the source transfer portion 41 and the drain transfer portion 42 is superior to the channel 43 to reduce the impedance, whereby provide a better conductive property to the thin film transistor of the liquid crystal display panel 200. The liquid crystal display panel 200 can be a flexible Organic Light-Emitting Diode, OLED or a liquid crystal display, LCM or LCD Module.

By the active layer 40 includes the source transfer portion 41 and the drain transfer portion 42 isolated from the source transfer portion 41 and the channel 43 integrally connected to the source transfer portion 41 and the drain transfer portion 42 makes the source transfer portion 41, the drain transfer portion 42 and the channel 43 becomes an integral structure, i.e., the contact resistance between the source transfer portion 41, the drain transfer portion 42 and the channel 43 is reduced, reducing the interface defects of the channel 43, so that the on-state current is increased, and the off-state current is reduced through the source transfer portion 41 and the drain transfer portion 42 of the thin film transistor of the liquid crystal display panel 200, that is the on/off ratio is raised to improve the performance of the array substrate 100.

In this embodiment, the substrate 10 is a flexible substrate. The substrate 10 includes a plastic layer 11 and a buffer layer 12 stacked on the plastic layer 11. The gate electrode 20 is stacked on the buffer layer 12 and opposite to the plastic layer 11. Specifically, the plastic layer 11 can be bent randomly, the material of the plastic layer 11 can be Polyethylene naphthalate, polyethylene terephthalate, polyethylene terephthalate or polyimide resin and other materials, the thickness of the plastic layer 11 can be 10 micrometers to 50 micrometers. The buffer layer 12 is formed by vacuum evaporation process on the plastic layer 11. The buffer layer 12 help to fix the gate electrode 20 to the plastic layer 11, so that the gate electrode 20 and the substrate 10 is connected more stable, and easy for the gate electrode 20 to facilitate molding. In other embodiments, the substrate 10 can also be a rigid plate.

The array substrate 100 further includes a source electrode 210 (the gray portion illustrated in FIG. 3), and a drain electrode 220 (the black portion illustrated in FIG. 3) on a barrier layer 50, the source electrode 210 is connected to the source transfer portion 41 through the first through hole 51, and the drain electrode 220 is connected to the drain transfer portion 42 through the second through hole 52.

In this embodiment, the gate electrode 20 are arranged in accordance with a predetermined pattern on the buffer layer 12, and can be formed by vapor deposition process. The gate electrode 20 is made of a metal filament structure, to play a role in the control of voltage. The gate insulating layer 30 provide an insulation environment to the gate electrode 20 and the active layer 40. The active layer 40 is made by the oxide semiconductor, the source transfer portion 41 and the drain transfer portion 42 located at both ends of the active layer 40 is formed by laser crystallization process. The characteristic of the source transfer portion 41 and the drain transfer portion 42 of the active layer 40 is similar to the source electrode 210 and drain electrode 220 of the liquid crystal display panel 200, therefore the contact resistance between the source transfer portion 41 and the source electrode 210 is less, and the contact resistance between the drain transfer portion 42 and the drain electrode 220 is less, thereby improving the conductive properties of the array substrate 100, i.e., the source transfer portion 41 can help to transmit the electrical signal from the gate electrode 20 to the source electrode 210 through the channel 43 and the drain transfer portion 42 can help to transmit the electrical signal from the gate electrode 20 to the drain electrode 220 through the channel 43. Thereby the contact resistance between the source transfer portion 41, the drain transfer portion 42 and the channel 43 is reduced, and increase the on-state current and the off-state current of the thin film transistor of the liquid crystal display panel 200.

In this embodiment, the source transfer portion 41, the drain transfer portion 42 and the channel 43 is integrally provided. Specifically, prior to form the source transfer portion 41, the drain transfer portion 42 and the channel 43, they are disposed above the metal oxide layer jointly, the metal oxide can be indium gallium zinc oxide. By irradiating a laser annealing process to the metal oxide layer is also called the laser crystallization process, so that both ends of the metal oxide is annealed to loss oxygen at the predetermined temperature to form the source transfer portion 41 and the drain transfer portion 42. While another portion of the metal oxide is formed as the channel 43 at a second predetermined temperature.

More specifically, the laser light is from the top of the barrier layer 50 irradiated to the metal oxide layer, the region of the metal oxide layer used to form the source transfer portion 41 and the drain transfer portion 42 is directly irradiated by the laser light, and the region of the metal oxide layer used to form the channel 43 is blocked by the barrier layer 50. By using the barrier layer 50 as a blocker can also form a temperature difference between the first predetermined temperature and the second predetermined temperature, and forming the source transfer portion 41, the drain transfer portion 42 and the channel 43 simultaneously by one process of the laser irradiation. In other embodiments, it can perform the laser irradiation having a first predetermined temperature to one portion of the metal oxide layer first, thereby forming the source transfer portion 41 and the drain transfer portion 42, and then perform the laser irradiation having a second predetermined temperature to another portion of the metal oxide layer, thereby forming the channel 43.

Further, the array substrate 100 further includes the barrier layer 50, the barrier layer 50 is provided with a first through hole 51 and a second through hole 52 isolated from the first through hole 51, and a light shielding area 53 formed between the first through hole 51 and the second through hole 52. The first through hole 51 and the second through hole 52 expose the source transfer portion 41 and the drain transfer portion 42 respectively, and the light shielding area 53 is covering the channel 43.

In this embodiment, the barrier layer 50 covers the entire active layer 40, and the first through hole 51 and the second through hole 52 can be formed by the etching process, and the first through hole 51 and the second through hole 52 correspond to the source transfer portion 41 and the drain transfer portion 42 respectively. Thereby, in the forming process of the source transfer portion 41 and the drain transfer portion 42, the first through hole 51 and the second through hole 52 expose the regions of the metal oxide layer to form the source transfer portion 41 and the drain transfer portion 42 respectively and makes the laser light can directly irradiate the exposed portion of the metal oxide layer, so that exposed portion of the metal oxide layer can be formed the source transfer portion 41 and the drain transfer portion 42 in the first predetermined temperature with a higher temperature. And another portion of the metal oxide layer is blocked by the light shielding area 53, to avoid the laser light directly irradiating to the region used to form the channel 43 in the metal oxide layer, part of the heat of the laser light is blocked to prevent excessive heat in the region so that channel 43 can be annealing and formed in the region of the metal oxide layer in the second predetermined temperature.

In other embodiments, the barrier layer 50 can be formed by vapor deposition process, whereby the first through hole 51 and the second through hole 52 is deposited and formed with the barrier layer 50.

Further, in this embodiment, the metal oxide layer can be irradiated by the high energy generated by the momentary laser pulse, the metal oxide layer obtains the high temperature and the crystal structure is changed correspondingly. By the great design of disposing the first through hole 51 and the second through hole 52 in the barrier layer 50, the source transfer portion 41, the drain transfer portion 42 and the channel 43 can be formed in the metal oxide layer simultaneously by one process of the laser crystallization process.

Further, in the laser crystallization process, the defects within the metal oxide can be significantly reduced by the high-temperature annealing process, and the performance of the formed thin film transistor can be optimized.

When the source transfer portion 41 is electrically connected to the source electrode 210 of the liquid crystal display panel 200, the source electrode 210 passes through the first through hole 51; the drain transfer portion 42 is electrically connected to the drain electrode 220 of the liquid crystal display panel 200, the drain electrode 220 passes through the second through hole 52.

Figure 2:
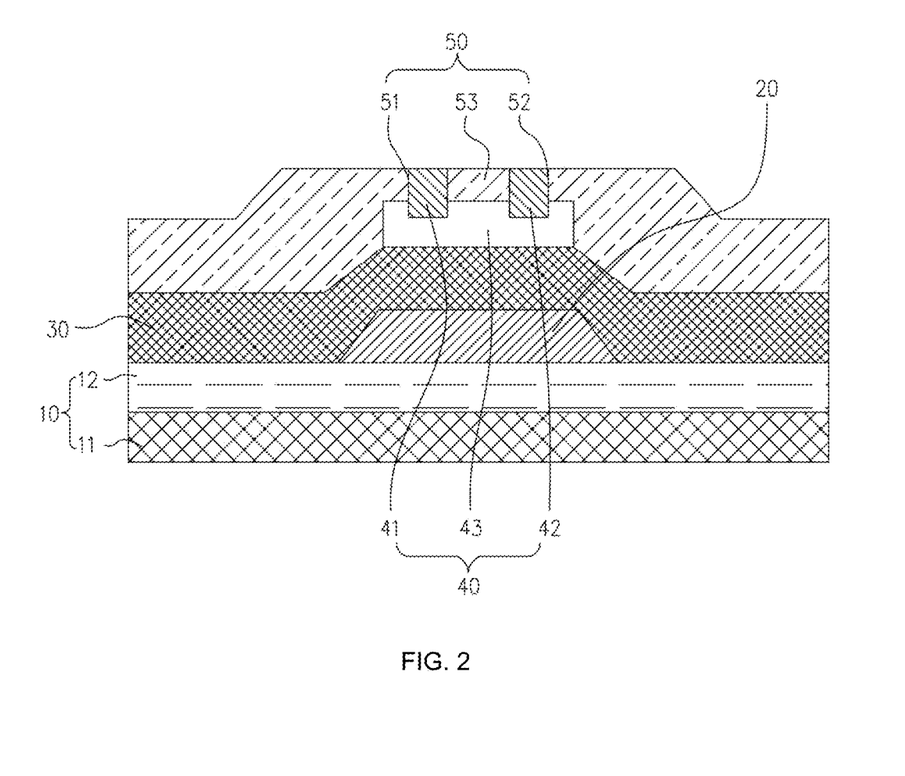
FIG. 2 illustrates a schematic structure of an array substrate of another embodiment of the present application.

Further, another embodiment is provided, as shown in FIG. 2, the source transfer portion 41 passes through the first through hole 51 and the drain transfer portion 42 passes through the second through hole 52. Specifically, the source transfer portion 41 and the drain transfer portion 42 are formed by a deposition process, the source transfer portion 41 is electrically connected to the source electrode 210 through the first through hole 51. The drain transfer portion 42 is electrically connected to the drain electrode 220 through the second through hole 52. So as the array substrate 100 applied to the liquid crystal display panel 200, the structures of the source electrode 210 and drain electrode 220 is simple, easy forming, thus improving the application performance of the array substrate 100.

Referring to FIG. 3, the present application also provides a liquid crystal display panel 200, the liquid crystal display panel 200 includes the array substrate 100, a liquid crystal layer 230 and a color filter substrate 240. The liquid crystal layer 230 is stacked on the source electrode 210 and the drain electrode 220; the color filter substrate 240 is stacked on the liquid crystal layer 230. Specifically, a portion of the source electrode 210 passes through the first through hole 51, and overlapped to the source transfer portion 41 and is electrically connected to the source transfer portion 41. A portion of the drain electrode 220 passes through the second through hole 52, and overlapped to the drain transfer portion 42 and is electrically connected to the drain transfer portion 42.

It can be understood that the present application is also applicable to a flexible display panel, an organic light emitting layer structure and an encapsulation layer structure can be continuously formed on the array substrate, the organic light emitting layer structure and the encapsulation layer structure are belonging to the regular structure of the organic light emitting display, and this is no longer specific described there.

Figure 4:
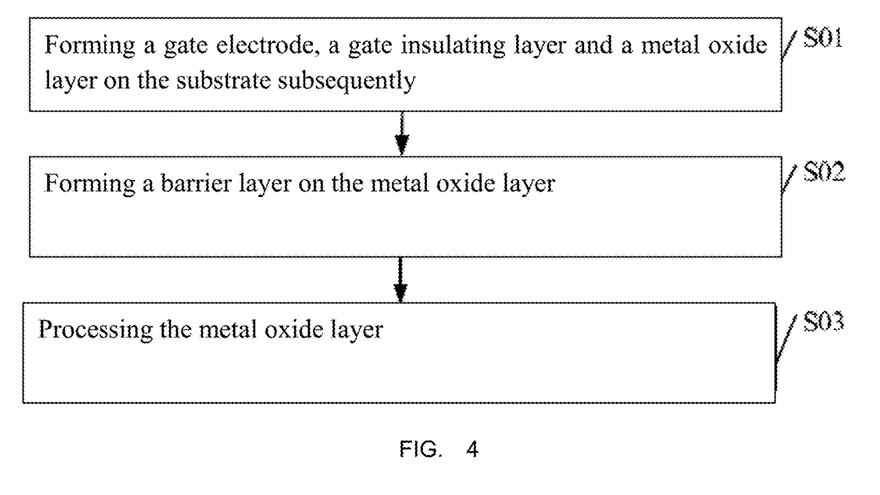
FIG. 4 illustrates a schematic flow of the steps of the method of manufacturing the array substrate of the present application.
Figure 5:
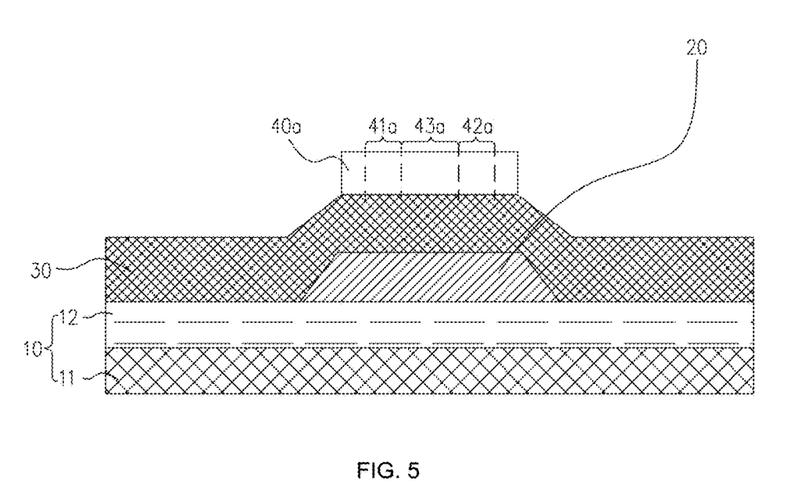
FIG. 5 illustrates a schematic structure of step S01 of the steps of the method of manufacturing the array substrate of the present application.
Figure 6:
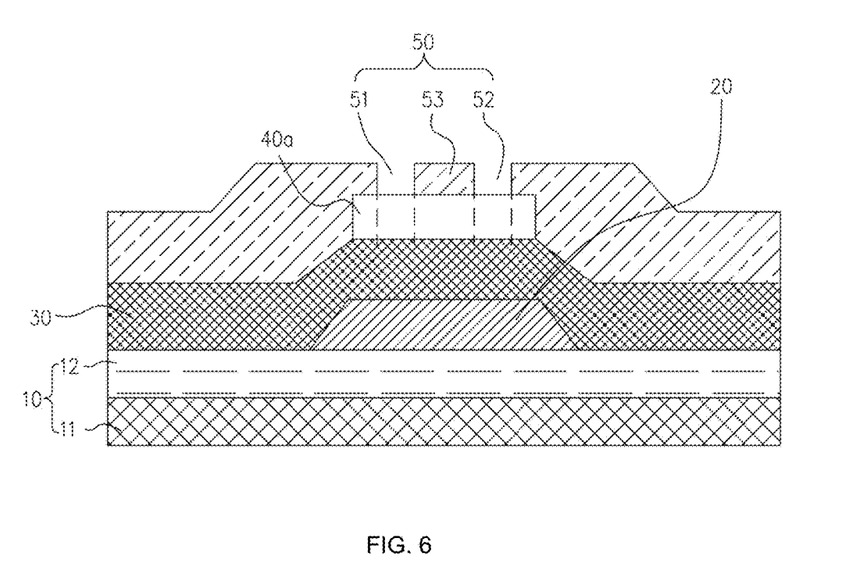
FIG. 6 illustrates a schematic structure of step S02 of the steps of the method of manufacturing the array substrate of the present application.

Further, referring to FIG. 4, FIG. 5 and FIG. 6, the present application also provides a method of manufacturing the array substrate, the method of manufacturing the array substrate is used to form the array substrate 100. The method of manufacturing the array substrate includes the steps:

S01: forming the gate electrode 20, the gate insulating layer 30 and the metal oxide layers 40a sequentially stacked on the substrate 10. The metal oxide layer includes a first region 41a and a second region 42a isolated from the first region 41a, and a third region 43a connected to the first region 41a and the second region 42a.

In this embodiment, the metal oxide layer is indium gallium zinc oxide. The oxygen vacancies is more in the metal oxide layer, resulting in poor conductive properties of the metal oxide, therefore a high temperature annealing process in needed to the metal oxide layer. The metal oxide layer is divided into three regions of the first region 41a, the second region 42a and the third region 43a. The first region 41a and the second region 42a are used to form the source transfer portion 41 and the drain transfer portion 42, the third region 43a is used to form the channel 43. As an embodiment, the metal oxide layer 40a can be form by a vacuum evaporation process, a deposition process. Then, the metal oxide layer is etched by the patterning process. S02: forming a barrier layer 50 on the metal oxide layer. The barrier layer 50 has the first through hole 51 and the second through hole 52 isolated from the first through hole 51, and the light shielding area 53 formed between the first through hole 51 and the second through hole 52. The first through hole 51 and the second through hole 52 expose the first region and the second region respectively, and the light shielding area 53 is covering the third region. The specific steps of S02 including the following steps:

Depositing the complete barrier layer to be processed on the metal oxide layer.

In this embodiment, the barrier layer to be processed is formed by vapor deposition process within a predetermined region, the barrier layer to be processed is completely covering the metal oxide layer.

The regions of the barrier layer to be processed corresponding to the first region and the second region are etched respectively to form the first through hole 51 and the second through the hole 52.

After the etching to form the first through hole 51 and the second through the hole 52 of the barrier layer to be processed, the light shielding area 53 is formed in the un-etched portion of the barrier layer to be processed connected to the first through hole 51 and the second through the hole 52, and by this process to form the barrier layer 50 after etching the barrier layer to be processed. In other embodiments, the light shielding area 53 can be formed by vacuum deposition on the metal oxide layer 40a corresponding to the third region 43a, and the regions corresponding to the first region 41a and the second region 42a are not been deposited, so that after the completion of the deposition process of the barrier layer 50, the first through hole 51 and the second through hole 52 are formed in the non-deposition region corresponding to the first region 41a and the second region 42a.

The first region 41a and the second region 42a of the barrier layer 50 are used to form the first through hole 51 and the second through hole 52. And by using the light shielding area 53 covering the third region 43a, thereby such that the source transfer portion 41, the drain transfer portion 42 and the channel 43 can be formed and realized by only one laser annealing irradiation process in different temperatures, saving the steps of the formation process, reducing production costs, improve production efficiency.

S03: the metal oxide layer is processed, the first region 41a and the second region 42a are formed into the source transfer portion 41 and the drain transfer portion 42 at a first predetermined temperature respectively, the third region 43a is formed the channel 43 at a second predetermined temperature.

In this embodiment, the metal oxide layer is annealed by the laser light irradiation process. Since the first through hole 51 and the second through hole 52 are exposed the first region 41a and the second regions 42a respectively, so that the first region 41a and the second region 42a are irradiated by the laser light directly, and thus the corresponding region of the metal oxide can be rapidly heated to the first predetermined temperature (above 500° C.), so that the oxygen in partial of the metal oxide in the first regions 41a and the second regions 42a is loss and form the source transfer portion 41 and the drain transfer portion 42 respectively. Since the light shielding area 53 is covering the third region 43a, it can prevent the laser irradiation directly onto the third region 43a, whereby the light shielding area 53 can absorb partial heat from the laser, the heat is transferring to the third region 43a through the light shielding area 53 and make the temperature of the third region 43a of the metal oxide raise to a second predetermined temperature (about 250° C. to 400° C.). The light shielding area 53 can prevent the third region 43a from the high process temperature, dividing the third region 43a from the first regions 41a and the second regions 42a, and forming the channel 43 eventually. By the light shielding area 53 of the barrier layer 50 to cover the third region 43a, thereby such that the source transfer portion 41, the drain transfer portion 42 and the channel 43 can be formed and realized by only one laser annealing irradiation process, saving the steps of the formation process, reducing production costs, improve production efficiency. In other embodiments, the first regions 41a and the second regions 42a can be irradiated by the laser light with a first predetermined temperature to form the source transfer portion 41 and the drain transfer portion 42, and the third regions 43a can be irradiated by the laser light with a second predetermined temperature to form the channel 43.

The present application provides an array substrate, a liquid crystal display panel and method of manufacturing the array substrate, by the design of the active layer includes the source transfer portion and the drain transfer portion isolated from the source transfer portion and the channel integrally connected to the source transfer portion and the drain transfer portion makes the source transfer portion, the drain transfer portion and the channel becomes an integral structure, i.e., the contact resistance between the source transfer portion, the drain transfer portion and the channel is reduced, so that the on-state current is increased, and the off-state current is reduced through the source and drain electrodes in the thin film transistor of the liquid crystal display panel, that is the on/off ratio is raised to improve the performance of the array substrate. In addition, in the laser irradiation process to form the source transfer portion and the drain transfer portion, the defects in the channel is significantly reduced by the annealing process, to improve the performance of thin film transistors.

Above are embodiments of the present application, which does not limit the scope of the present application. Any modifications, equivalent replacements or improvements within the spirit and principles of the embodiment described above should be covered by the protected scope of the invention.

What is claimed is:

1. A method of manufacturing an array substrate, comprising:

forming a gate electrode, a gate insulating layer and a metal oxide layer on an substrate subsequently, such that the metal oxide layer comprises a first region and a second region separated from the first region, and a third region connected to the first region and the second region; and processing the metal oxide layer such that surface parts of the first region and the second region that are adjacent to a surface of the metal oxide layer distant from the gate isulating layer are formed into a source transfer portion and a drain transfer portion at a first predetermined temperature, respectively, and the third region is formed, at a second predetermined temperature, into a channel that connects between the surface parts of the first and second regions that are formed into the source and drain transfer portions, wherein the surface parts of the first region and the second region that are formed into the source transfer portion and drain transfer portion are integral portions of the metal oxide layer and are integrally connected with the channel.

2. The method of manufacturing an array substrate according to claim 1, further comprising:

forming a barrier layer on the metal oxide layer, the barrier layer comprising a first through hole and a second through hole isolated from the first through hole, and a light shielding area formed between the first through hole and the second through hole; wherein the first through hole and the second through hole expose the surface parts of the first region and the second region respectively; and the light shielding area covers the third region; and wherein the step of "processing the metal oxide layer" comprises applying an annealing process at one side of the barrier layer that is opposite to the metal oxide layer.

3. The method of manufacturing an array substrate according to claim 2, wherein the annealing process is realized by a laser crystallization process.

4. The method of manufacturing an array substrate according to claim 2, wherein the step of forming a barrier layer on the metal oxide layer comprises:

forming a complete barrier layer to be processed on the metal oxide layer; and etching portions of the barrier layer to be processed corresponding to the first region and the second region respectively to form the first through hole and the second through the hole.

* * * * *